United States Patent

Kim

[15] 3,663,861

[45] May 16, 1972

[54] CIRCUIT UTILIZING FEEDBACK AMPLIFIER FOR SEQUENTIALLY FLASHING PHOTOFLASH LAMPS

[72] Inventor: Sang-Chul Kim, Cleveland Heights, Ohio

[73] Assignee: General Electric Company

[22] Filed: Dec. 28, 1970

[21] Appl. No.: 101,797

[52] U.S. Cl. ..............................315/232, 307/293, 315/251, 315/323, 315/325, 315/341 P, 328/75, 340/331

[51] Int. Cl. ..........................................................H05b 41/34

[58] Field of Search ................................315/228–232, 250, 315/251, 313, 323, 241 P, 87, 325; 328/75; 307/293; 340/250, 251, 331

[56] References Cited

UNITED STATES PATENTS

| | | | |
|---|---|---|---|
| 3,518,487 | 6/1970 | Tanaka et al. | 315/232 |
| 3,532,931 | 10/1970 | Cote et al. | 315/323 X |
| 2,955,201 | 10/1960 | Miller | 315/323 X |
| 2,995,926 | 8/1961 | Dory | 315/231 |
| 3,560,769 | 2/1971 | Shimizu et al. | 307/293 |
| 3,590,314 | 6/1971 | Krusche | 328/75 |

*Primary Examiner*—Alfred L. Brody
*Attorney*—Norman C. Fulmer, Henry P. Truesdell, Frank L. Neuhauser, Oscar B. Waddell and Joseph B. Forman

[57] ABSTRACT

A circuit combination of impedance devices and a feedback amplifier for causing sequential flashing of a plurality of photoflash lamps by sequential firing voltage pulses. The amplifier is connected between the source of firing pulses and the impedance network formed by the impedance devices and flash lamp filaments, and the impedance network is connected to provide inverse feedback to the amplifier to vary its gain in accordance with changing impedance of the impedance network as the various lamps are flashed, so that the lamps will be flashed by equal amounts of firing pulse energy.

7 Claims, 3 Drawing Figures

Inventor:
Sang-Chul Kim
by Norman C. Fulmer
His Attorney

CIRCUIT UTILIZING FEEDBACK AMPLIFIER FOR SEQUENTIALLY FLASHING PHOTOFLASH LAMPS

BACKGROUND OF THE INVENTION

The invention is in the field of electrical circuitry for sequentially flashing photoflash lamps, and is particularly useful with a unitary array of flash lamps, such as three or four or more lamps arranged to radiate their light in the same direction when they are sequentially flashed, so that the array need not be moved nor removed until all of its lamps have been flashed.

Numerous circuits have been devised for sequentially flashing photoflash lamps by pulses of electrical energy such as are obtained from a battery through a momentarily closed switch or from a capacitor which has been charged through a resistor from a battery, or from some other suitable energy source. Such a pulse of electrical energy usually is initiated by closure of a switch associated with the shutter mechanism of a camera. One type of circuit heretofore proposed employs mechanically actuated switches for applying the electrical pulses to successively different flashbulbs; another type of circuit utilizes heat-responsive or light-responsive means associated with the flash lamps and adapted to actuate switching means for connecting the pulse source to successively different flash lamps as each of the lamps becomes flashed; and a further type of circuit utilizes transistors or thyristors for automatically connecting the pulse source to successively different flash lamps as each of the lamps becomes flashed.

Another previously proposed type of circuit employs impedance means, such as resistors, successively connected in series with a plurality of individual flash lamps, so that the lamps are connected in electrical parallel through the resistors. The firing pulse source is connected to an end of the circuit, whereby each flash lamp is connected across the pulse source through successively greater resistance. The first pulse flashes the nearest lamp, which becomes an open circuit upon flashing, whereupon the next pulse flashes the next lamp, etc. As each successive lamp is flashed, its firing pulse flows through successively greater values of power-consuming series resistance, so that the later lamps in the array receive considerably less of the firing pulse energy than do the earlier lamps. The firing pulses must have ample energy to insure flashing of the later lamps in the circuit, and therefore the earlier lamps receive much greater firing pulse energy than is needed for flashing them. In order to insure flashing of only one flash lamp (the nearest unflashed lamp to the pulse source) per firing pulse, it is desirable that the series resistors have relatively large values of resistance as compared to the resistances of the flash lamp filaments. On the other hand, low values of series resistances are desired, because large values of series resistance consume relatively large amounts of energy from the firing pulse so that it is desirable to provide a greater amount of firing pulse energy to insure that all of the lamps can be flashed. It has been found that this dilemma of desiring larger resistance values for one reason, and smaller resistance values for another reason, is not easy to resolve satisfactorily for insuring that only one flash lamp will flash per firing pulse and also that the energy per pulse will be capable of successively flashing all of the lamps of the array, with an economically feasible value of firing pulse voltage. These difficulties tend to offset an important advantage of the resistance network circuit: its low cost, so that the resistor circuit can be included in a throw-away multiple lamp unit, whereby only two electrical connections need be provided between the multiple lamp unit and the camera or flash adaptor with which it is used.

The reliability of the above-described resistance sequential flashing circuit can be improved if the flash lamps of the array have differing filament resistances, the lamp nearest the firing pulse source having the lowest filament resistance and the remaining lamps having successively higher values of filament resistance. However, this expedient suffers the disadvantage of higher costs of manufacturing the different-resistance lamps and of keeping track of which lamps have which filament resistance during storage and during assembly into the flash array. Another disadvantage of an array in which the lamps have differing filament resistances, is a reduction of flashing reliability because some of the lamps will not have optimum filament resistance for being flashed by the firing pulse.

SUMMARY OF THE INVENTION

Objects of the invention are to provide an improved circuit for sequentially flashing flashbulbs; to provide such a circuit which is free from the above-described disadvantages of prior resistance types of circuits; and to provide such a circuit that is highly reliable in operation.

The invention comprises, briefly and in a preferred embodiment, a plurality of photoflash lamps intended to be sequentially flashed by a sequential series of firing voltage pulses, impedance means electrically interconnecting said lamps and forming in combination therewith an impedance network to cause the lamps to be flashed sequentially by said firing pulses, the impedance of said impedance network being subject to change upon flashing of said lamps, a feedback amplifier connected between said impedance network and a source of said firing pulses, and means connecting said impedance network to provide inverse feedback to said amplifier so that said lamps will be flashed by substantially equal values of firing pulse energy.

DESCRIPTION OF THE PREFERRED EMBODIMENT

Figure 1:
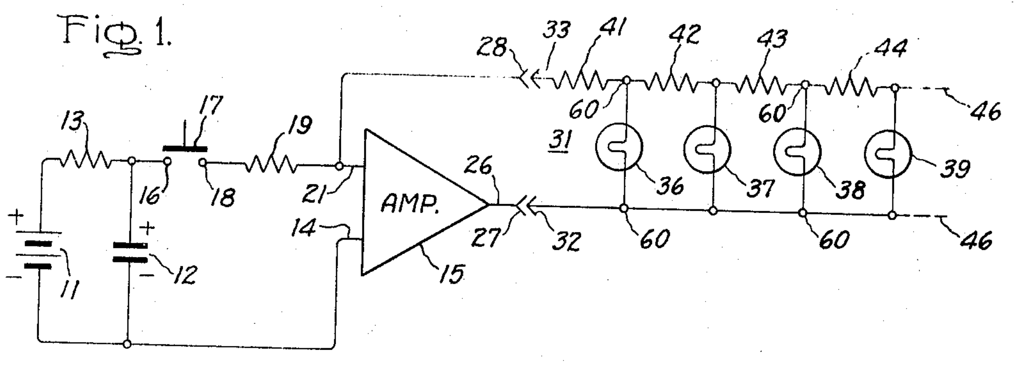
FIG. 1 is an electrical diagram of a preferred embodiment of the invention.

In the circuit of FIG. 1, a battery 11 is connected to charge a capacitor 12 through a resistor 13. In a preferred arrangement, the battery 11 has a voltage of 6 volts, the capacitor 12 has a capacitance of 500 microfarads, and the resistor 13 has a resistance of 1000 ohms. One terminal of the capacitor 12 is connected to an input terminal 14 of an operational amplifier 15, and the other terminal of capacitor 12 is connected to a terminal 16 of a switch 17, the other terminal 18 thereof being connected through a resistor 19 to a second input terminal 21 of the amplifier 15. The switch 17 is adapted to be momentarily closed in synchronization with the opening of a camera shutter, in well-known manner. An amplifier output terminal 26 is connected to a first connector terminal 27, and the amplifier input terminal 21, which also functions as an output terminal, is connected to a second connector terminal 28. The circuitry thus far described functions as a source of electrical energy pulses applied at the connector terminals 27 and 28 for flashing photoflash lamps, and may be incorporated in a camera, or in a flash attachment for use with a camera. Although the firing pulse is sometimes called a "voltage" pulse, it is primarily the energy of the pulse, comprising the product of voltage, current, and time duration, that causes a lamp to flash. The amplifier 15 preferably is an operational amplifier, which is a type of amplifier, preferably transistorized, well known in the electronics art, such as General Electric No. GEL 1741.

A flash lamp array unit 31 is provided with a pair of connector prongs 32 and 33 adapted for electrical engagement with the terminals 27 and 28, respectively. The unit 31 contains a plurality of photoflash lamps 36 through 39 which may be of conventional type, such as General Electric type AG-1, each containing a filament provided with electrical connection lead wires and adapted for initiating a flash of combustible material contained within the bulb. One end of the filaments of each of the lamps 36–39 is connected to the connector prong 32. The other ends of the filaments of lamps 36–39 are successively connected, through a series of resistors 42 through 44, to the connector prong 33. The resistors 41–44 may be individual resistors or they may be a single resistor tapped at appropriate points. Other impedance means, such as diodes or inductances, may be used instead of resistors. Various desired numbers of flash lamps and impedance devices can be added to the circuit as indicated by dashed lines 46. Thus, in effect, the lamps 36–39 are connected in a parallel combination through the resistors 41–44, this parallel combination being adapted for connection across the source of energy pulses at the terminals 27 and 28, each successive lamp being connected to the pulse source through a successively greater value of resistance. Typically, each of the lamps 36–39 may have a filament resistance of about 0.6 ohms, and each of the resistors 41–44 may have a resistance of about 5 or 6 ohms. The resistance of resistor 19 is relatively smaller, such as about 1 or 2 ohms.

Preferably the lamps 36–39 of the array 31 are provided with individual reflectors, and arranged to radiate the light emitted therefrom in the same direction. If desired, another combination of lamps and impedances may be provided in the unit 31, for radiating the light emission in the opposite direction, so that when all of the lamps at the front of the unit have been flashed, the unit may be turned around so that the rear array of lamps will then face frontwardly, for obtaining an additional number of flashes from a single unit. Other connector prongs similar to 32 and 33 can be provided for connecting the rear array of lamp circuitry to the connectors 27 and 28 when the unit is turned around so that the "rear" array of flash lamps faces frontwardly.

The operation of the circuit of FIG. 1 will now be described, first (with reference to FIG. 2) with the amplifier 15 omitted and with its output lead 26 connected directly to its input lead 14, and then the operation will be described (with reference to FIG. 3) with the amplifier in the circuit as shown in FIG. 1, in accordance with the invention.

Assume the amplifier 15 is omitted, as just described. Upon a momentary closing of the switch 17, in synchronization with the opening of a camera shutter, the electrical energy stored in the capacitor 12 discharges into the circuit of the lamp unit 31, in the form of an electrical pulse having an approximately exponential decay characteristic. Most of the capacitor's electrical energy discharges through the filament of the first lamp 36, and, although a small portion of the energy flows through the filament of lamp 37 via the resistor 42, the voltage drop across the resistor 42 is intended to limit the amount of electrical energy discharged through the filament of lamp 37 to a value below that which will cause lamp 37 to flash. The remaining resistors in the circuit further limit the amount of energy discharged into the remaining flash lamps. As the electrical energy of the pulse from capacitor 12 discharges through the filament of lamp 36, the filament resistance (which initially is about 0.6 ohms) increases as the filament becomes incandescent, and the filament burns out and becomes an open circuit as the lamp flashes. The moment at which the lamp 36 flashes and its filament becomes an open circuit, is a critical moment at which the next lamp 37 is most likely to undesirably flash, because when the filament of lamp 36 becomes an open circuit the remaining energy in capacitor 12, minus the voltage drop provided by the resistors 19, 41, and 42, is available for the remaining lamps.

Upon the next momentary closing of the switch 17, in synchronization with the opening of the camera shutter, most of the electrical discharge pulse energy from the capacitor 12 flows through the second flash lamp 37, since the first lamp 36 now is an open circuit. The energy discharge through lamp 37 is reduced by the voltage drop across the resistors 19, 41, and 42, but is ample for causing the lamp 37 to flash. As was the case when lamp 36 was being flashed, the next successive resistor 43 is intended to reduce the voltage, and hence energy, flowing to the remaining lamps so that they will not flash.

Figure 2:
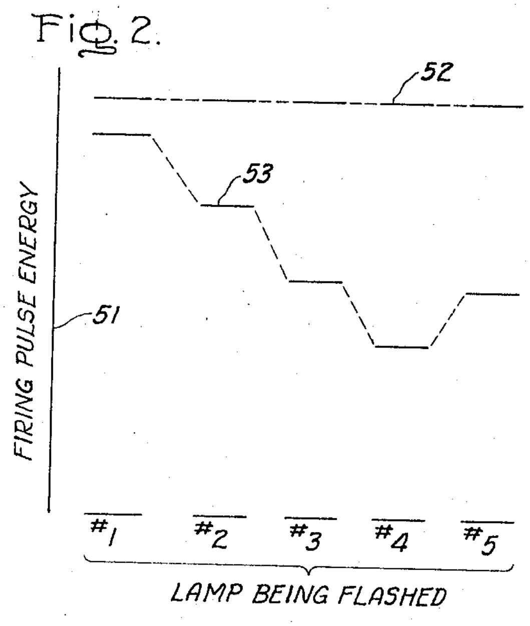
FIG. 2 is a chart illustrating the operation of the circuit of FIG. 1 when the feedback amplifier is omitted.

Thus, as each next successive lamp is flashed, its firing pulse passes through a greater value of energy-consuming resistance and each lamp receives successively less energy from the firing pulse. This is illustrated in FIG. 2, in which the successive lamps (five of them, for example) are represented along the horizontal base line, as indicated, and the vertical axis 51 represents firing pulse energy. The plot 52 indicates, in the solid-line portions thereof, the firing pulse energy applied to the lamp circuit terminals 32, 33 by the discharge of the capacitor 12, upon flashing each of the five lamps, this energy being the same value for each lamp flashing. The plot 53 indicates, in the solid-line portions thereof, the amount of firing pulse energy that reaches each successive lamp that is being flashed. As explained above, only part of the firing pulse energy is applied to the lamp being flashed, due to firing pulse energy consumption both in the resistance in series with the lamp being flashed and also in the shunt resistance path formed by the remaining unflashed lamps and their associated resistors. As a result, and as shown by the plot 53, each successive lamp that is flashed receives considerably less firing pulse energy than the preceding lamp, with exception of the last lamp which receives a bit more firing pulse energy than did the preceding lamp because there is no unflashed lamp and associated resistor in shunt with the last lamp. The total resistance of the network formed by the lamps and resistors increases successively with each lamp flashed, until it becomes an open circuit when all lamps have been flashed. As explained earlier, the differing amounts of firing pulse energy that are successively applied to the lamps being flashed makes it difficult to design a circuit which will reliably flash a single lamp upon the occurrence of each firing pulse, and such design is all the more difficult when reasonable manufacturing tolerances are set for the resistor values and lamp filament characteristics.

The circuit of FIG. 1, with the feedback amplifier 15 connected as shown, operates as follows, in accordance with the invention and with reference to FIG. 3. The circuit functions generally as described above except that each firing pulse passes through the feedback amplifier 15, and the gain of the amplifier is varied as a function of inverse feedback applied from its output 26, through the impedance network of the lamp array 31 as constituted by the filaments of its unflashed lamps and the resistors 41–44, to the amplifier input 21. Thus, when none of the lamps 36–39 has been flashed, the impedance of the feedback network is relatively small, and the inverse feedback is relatively large, and hence the gain of the amplifier is relatively low. As the lamps 36–39 are successively flashed, the impedance of the array 31 successively increases, whereby the amount of inverse feedback decreases, and hence the gain of the amplifier 15 increases, whereby as more lamps have been flashed relatively greater amounts of firing pulse energy are applied to the input terminals 32–33 of the array 31, so that each lamp being flashed receives substantially the same value of firing pulse energy. This greatly increases the reliability of flashing a single flash lamp per firing pulse, and permits a greater freedom of tolerance limits for values of the resistors 41–44 and filament characteristics (resistance and speed of burn-out) of the lamps 36–39.

Figure 3:
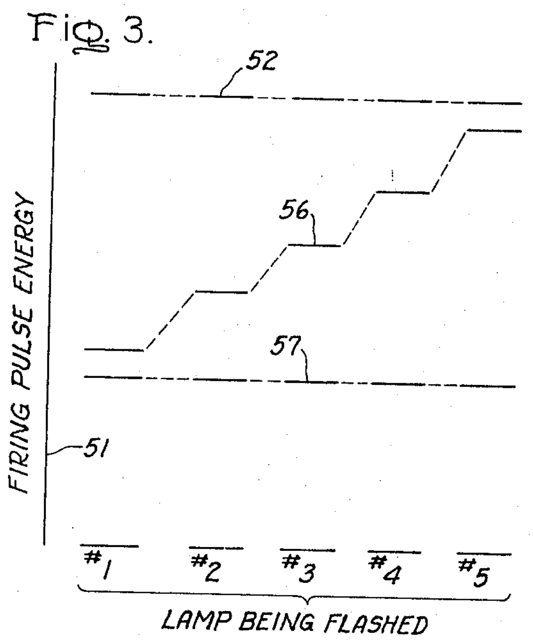
FIG. 3 is a chart illustrating the operation of the circuit of FIG. 1 employing an inverse feedback amplifier in accordance with the invention.

The just-described improved operation achieved by the invention is illustrated by FIG. 3, in which the horizontal base line represents five lamps of an array and the vertical axis 51 represents firing pulse energy, as in FIG. 2. In FIG. 3, the solid-line portions of plot 52 indicate the energy of each firing pulse supplied by discharge of the capacitor 12, this energy being the same for each firing pulse. Plot 56 represents the gain of the amplifier 15, which increases as each lamp is flashed, as has been described above. Expressed another way, the amplifier reduces the amount of firing pulse energy reaching the lamp array 31 when the first lamp 36 is flashed, and this reduction of energy diminishes for each successive lamp flashing. Plot 57 represents, in the solid-line portions thereof, the amount of firing pulse energy applied to each lamp that is flashed, these amounts of firing pulse energy being the same for each lamp due to the variable-gain functioning of the amplifier 15, as described above. The gain of the amplifier, as used herein, includes gain of less than unity (actually a loss) as well as gain greater than unity. Preferably the amplifier has a gain considerably greater than unity, as this is readily achieved and in a small size if made with integrated circuit techniques. An advantage of using a high-gain amplifier is the fact that as the gain of the amplifier is made larger, the capacitance value and hence size of the capacitor 12 can be made smaller. For the purpose of FIG. 3, it is assumed that the amplifier 15 has a gain of less than unity, so that the plots of FIG. 3 can more readily be compared with those of FIG. 2. In actual practice, with an amplifier gain of greater than unity, the plot 57 would be relatively at a higher energy level with respect to plot 52, and in a practical circuit plot 57 will be at a higher energy level than plot 52. The amplifier gain is varied by the amount of inverse feedback, which is determined by the inverse ratio of the impedance of the feedback network 31 to that of the input impedance of the amplifier 15 which is determined primarily by the value of input resistor 19.

After all of the lamps in the array 31 have been flashed, the array may be discarded, and a new array may be plugged into operative position.

The resistors 41–44 can be incorporated into a camera or flash adaptor instead of in a disposable flash array, with the requisite number of electrical connectors being provided for connecting the filament lead wires of the lamps 36, etc., of the array respectively to the different connection terminal points 60 of the series resistors network.

The invention can be applied to various type of sequential flash-control circuits or networks which have the above-described characteristic of a changing value of impedance as the various lamps are flashed. The firing pulse is applied to such a circuit by means of a variable-gain amplifier, and the gain (or loss) of the amplifier is controlled by the changing impedance of the lamp circuit so as to apply a desired amount of firing pulse energy to each lamp that is flashed.

While preferred embodiments and modifications of the invention have been shown and described, other embodiments and modifications thereof will become apparent to persons skilled in the art, and will fall within the scope of invention as defined in the following claims.

What I claim as new and desire to secure by Letters Patent of the United States is:

1. A circuit for causing a plurality of photoflash lamps to be flashed sequentially by sequential electrical firing pulses, comprising a plurality of said flash lamps and impedance means electrically interconnecting said lamps thereby forming an impedance network adapted to be connected to a source of sequential firing pulses and cause a predominant amount of each sequential firing pulse to be applied to a single unflashed lamp, said impedance network having the characteristic of changing impedance as the lamps are flashed, wherein the improvement comprises a feedback amplifier connected between said impedance network and a source of said firing pulses whereby said firing pulses will pass through said amplifier, and means connecting said impedance network to provide inverse feedback to said amplifier for varying the gain thereof so that said lamps will be flashed by substantially equal amounts of firing pulse energy.

2. A circuit as claimed in claim 1, in which said impedance network comprises a plurality of resistances successively connected electrically in series between said lamps thereby connecting the lamps in an electrical parallel circuit through said resistances, and means connecting a first lamp at one end of said parallel circuit between an output and an input of said amplifier.

3. A circuit as claimed in claim 2, including an input resistor connected at said input of the amplifier, whereby the resistance ratio of said input resistor and said impedance network will determine the amount of inverse feedback applied to said amplifier for causing said substantially equal amounts of firing pulse energy to be applied to the lamps as they are flashed.

4. A firing pulse circuit for applying firing pulses sequentially to an impedance network comprising a plurality of photoflash lamps and impedance means electrically interconnecting said lamps, said impedance network having the characteristic of changing impedance as the lamps are flashed, said firing pulse circuit comprising firing pulse means for providing sequential firing pulses of equal magnitude, and a pair of terminals adapted for connection thereto of said flash lamp impedance network, wherein the improvement comprises a feedback amplifier connected between said firing pulse means and said pair of terminals, and means connecting one terminal of said pair to an input of said amplifier, whereby said flash lamp impedance network when connected to said pair of terminals will provide inverse feedback to said amplifier to vary the gain thereof so that said lamps will be flashed by substantially equal amounts of firing pulse energy.

5. A circuit as claimed in claim 4, including an input resistor connected at said input of the amplifier, whereby the resistance ratio of said input resistor and said impedance network will determine the amount of inverse feedback applied to said amplifier for causing said substantially equal amounts of firing pulse energy to be applied to the lamps as they are flashed.

6. A circuit as claimed in claim 4, in which said amplifier has a gain of greater than unity.

7. A circuit as claimed in claim 6, in which said firing pulse means comprises a capacitor and means for electrically charging said capacitor, said capacitor having a value of capacitance that is less than would be required for providing said firing pulses if said amplifier had a gain of unity or less.

* * * * *